United States Patent [19]

Terasawa et al.

[11] Patent Number: 5,022,000
[45] Date of Patent: Jun. 4, 1991

[54] SEMICONDUCTOR MEMORY DEVICE

[75] Inventors: Masaaki Terasawa; Hidefumi Mukohda; Yoshikazu Nagai, all of Akishima; Yasunori Ikeda, Kawagoe; Kazunori Furusawa, Kokubunji, all of Japan

[73] Assignees: Hitachi, Ltd.; Hitachi VLSI Engineering Corp., both of Tokyo, Japan

[21] Appl. No.: 403,372

[22] Filed: Sep. 6, 1989

[30] Foreign Application Priority Data

Sep. 6, 1988 [JP] Japan .................. 63-223055

[51] Int. Cl.[5] .................................. G11C 11/34
[52] U.S. Cl. ..................... 365/184; 365/189.09; 365/189.11; 365/218
[58] Field of Search ............... 365/182, 184, 185, 104, 365/189.05, 189.09, 189.11, 218; 357/23.5

[56] References Cited

U.S. PATENT DOCUMENTS 4,769,787 9/1988 Furusawa et al. .................. 365/184

FOREIGN PATENT DOCUMENTS 55-156370 12/1980 Japan .

OTHER PUBLICATIONS

Nikkei Electronics 1986 (No. 388), pp. 142-145, "64 Kbit Peripheral CMOS EEPROMs".

Primary Examiner—Joseph A. Popek
Attorney, Agent, or Firm—Antonelli, Terry, Stout & Kraus

[57] ABSTRACT

A writing high voltage of one polarity or an erasing high voltage of another polarity is selectively fed, in accordance with a writing or erasing operation mode, via a switch MOSFET to the word line of a non-volatile memory element designated by an address signal. The potential of a well region, where the switch MOSFET is existent, is changed in conformity with the switching action of the relevant switch MOSFET so as to control the switch MOSFET. Due to this arrangement, the potential of the well region with the non-volatile memory elements existing thereon can be retained at a fixed value, so that the high voltage generator is required merely to drive the selected word line of the memory array (and not the well in which the memory elements are formed). Consequently, the requisite current supply capability of the high voltage generator can be diminished.

35 Claims, 4 Drawing Sheets

SEMICONDUCTOR MEMORY DEVICE

BACKGROUND OF THE INVENTION

The present invention relates to a semiconductor memory device and, more particularly, to the technique effectively utilizable for an EEPROM (electrically erasable and programmable read-only memory) employing, for example, non-volatile memory elements such as MNOS (metal nitride oxide semiconductor) transistors.

Conventional EEPROMs such as "HN58064" or "HN58C65" (made and sold by Hitachi, Ltd.) are internally equipped with a bootstrap circuit to generate a high voltage for writing and erasing operations. In this case, the writing or erasing operation is performed through switchover by the selective application of such high voltage either to the gate electrode of the MNOS transistor or to a well region where the MNOS transistor is formed.

One example of such EEPROM is disclosed in Japanese Patent Laid-open No. 55 (1980)-156370.

SUMMARY OF THE INVENTION

According to the studies promoted by the present inventor with regard to the system that selectively performs a writing operation or an erasing operation by relatively switching the potential between the gate electrode of the MNOS transistor and the well region serving as its substrate gate, the well region becomes dimensionally greater in conformity with an increase of the storage capacity. Therefore, the parasitic capacitance between the well region and the substrate also increases to consequently necessitate a greater driving current for raising the well region voltage to a sufficiently high level. As a result, it becomes requisite to enhance the current drive capability of the bootstrap circuit used to produce such high voltage. And for the purpose of meeting such requirement, both the driving MOSFET (insulated gate type field effect transistor) and the capacitor constituting the bootstrap circuit need to be larger, so that the layout area is increased to eventually bring about a major problem of impediment in attaining a great storage capacity. Furthermore, the power consumption is also increased due to necessity of enhancing the current drive capability of the bootstrap circuit.

It is therefore an object of the present invention to provide an improved semiconductor memory device which realizes dimensional reduction of a high voltage generator employed to generate writing and erasing high voltages.

The above and other objects of the present invention as well as the advantageous novel features thereof will be apparent from the following detailed description and the accompanying drawings.

The summary of some typical inventive means disclosed in the present application will now be briefly described below.

A writing high voltage of one polarity and an erasing high voltage of another polarity are generated individually, and in accordance with a writing mode or an erasing mode, either of such high voltages is selectively fed via a switch MOSFET to the word line of a non-volatile memory element designated by an address signal. The potential in the well region, where the switch MOSFET is existent, is changed in compliance with the switching operation of the switch MOSFET so as to control the same. According to the means mentioned, it becomes possible to retain the potential fixed in the well region where the non-volatile memory element is existent. And the requisite for the high voltage generator is merely to drive a selected word line, so that the required current supply capability of the high voltage generator can be diminished.

DESCRIPTION OF THE PREFERRED EMBODIMENTS

Figure 4:
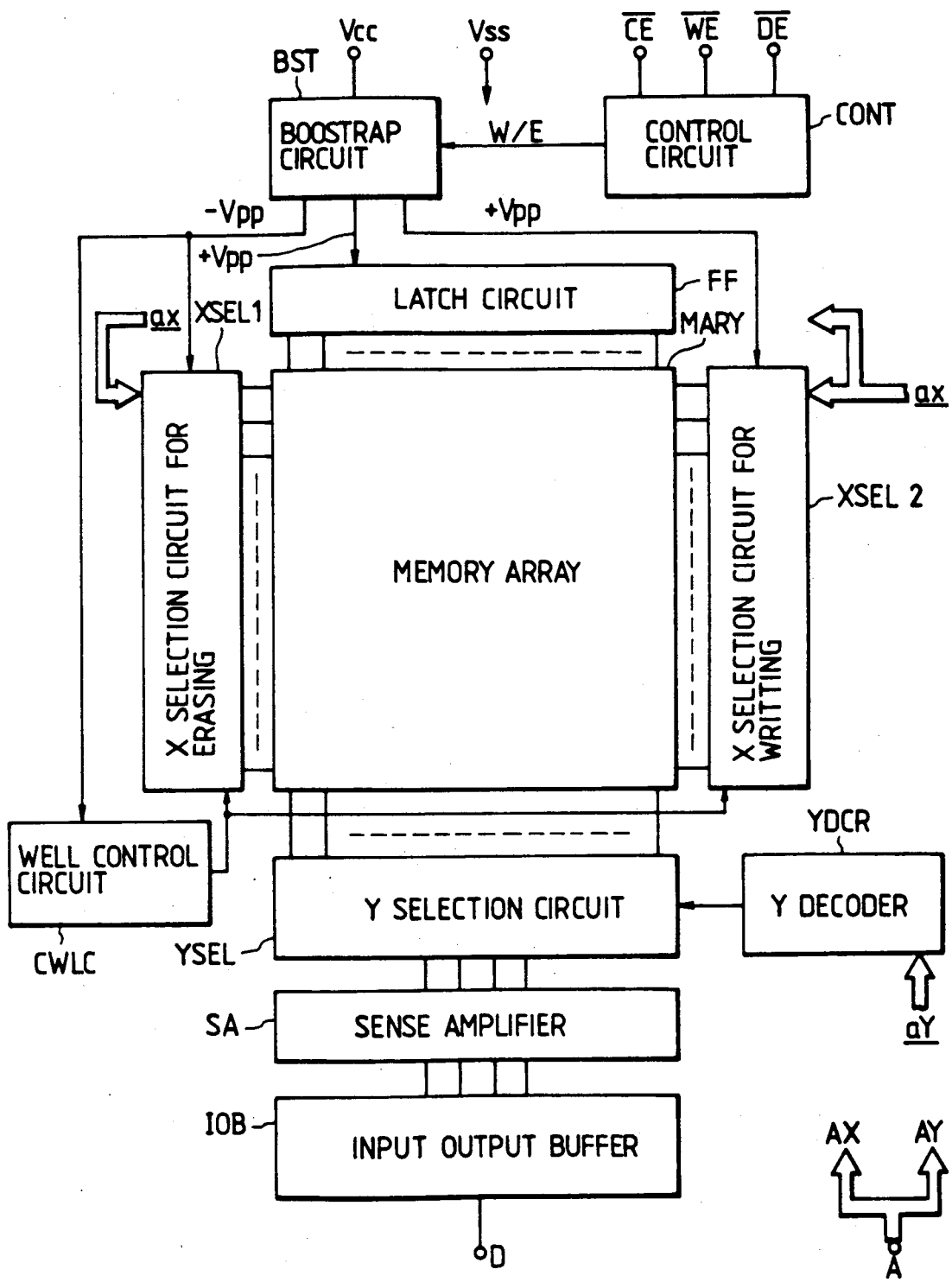
FIG. 4 is a schematic block diagram of an EEPROM unit where the present invention is applied.

FIG. 4 is an exemplary block diagram schematically showing the entire constitution of an EEPROM device where the present invention is applied. The individual circuit blocks in this diagram are formed by known semiconductor IC manufacturing techniques on a single semiconductor substrate which is composed of monocrystal silicon or the like, although not restricted thereto particularly. Also in this diagram, the principal circuit blocks are illustrated in conformity with the practical arrangement formed on the semiconductor substrate, although the invention is not particularly limited in this regard.

A memory array MARY comprises, as will be described later with reference to FIG. 1, a matrix of non-volatile memory elements such as MNOS transistors adapted to be electrically writable and erasable, and memory cells composed of address selecting MOSFETs. The memory array MARY further includes a plurality of data lines where input-output nodes of the memory cells are connected respectively, and a plurality of word lines where the memory cells are coupled respectively.

To the individual data lines in the memory array MARY, there are coupled unitary latch circuits which enable page rewriting, as will be described later. In FIG. 4, such unitary latch circuits are grouped together and represented as a latch circuit FF. A group of the memory cells connected to the same word line are formed on a single well region. Byte-by-byte rewriting is executed by first reading out the entire data of one row (word lines) to the corresponding data lines, then storing the data in the unitary latch circuits coupled to such data lines, and erasing the stored data in the memory cells coupled to the relevant word lines. And after designation of the unitary latch circuit to be rewritten out of the latch circuit FF, the data to be rewritten is stored in such unitary latch circuit, and the entire data of one row held in the latch circuit FF are written together in the memory cells. In this constitution, a page reading mode is also possible in such a manner that the data stored in the latch circuit FF are read out sequentially (serially).

In this embodiment, although not restrictive particularly, there are provided an erasing X selection circuit XSEL1 and a writing X selection circuit XSEL2 on the two sides of the memory array MARY so as to select one of the word lines included in the memory array MARY and then to set the selected word line at a predetermined level. The X selection circuit XSEL1 serves as an erasing selector, while the X selection circuit XSEL2 serves as a writing selector. Each of such two X selection circuits XSEL1 and XSEL2 comprises an X decoder, a level converter for producing, in an erase mode or a write mode, an erasing high voltage $-Vpp$ or a writing high voltage $+Vpp$ which is to be supplied to the gate electrode of the memory element (MNOS transistor), and a switch MOSFET for feeding the output signal of such level converter to the word line, to which the gate electrode of the MNOS transistor is coupled, in accordance with the operation mode.

Under the memory array MARY in the diagram, there is provided a Y selection circuit YSEL which comprises a plurality of column switches. And one of such column switches designated by a Y address signal AY is turned on by the output signal of a Y decoder YDCR. As a result, one data line connected to the column switch thus turned on is selected out of the plural data lines in the memory array MARY.

The signal of the data line selected by the Y selection circuit YSEL is amplified by a sense amplifier SA. For example, the Y selection circuit YSEL is designed to select 8 data lines, so that the sense amplifier SA is constituted of 8 unitary sense amplifier circuits connected correspondingly thereto.

In the read mode, the amplified signal obtained from the sense amplifier SA is outputted from an external terminal D via a data output buffer of an input-output buffer IOB. Meanwhile in the write mode, the write data supplied from the external terminal D is fed via the Y selection circuit YSEL and the memory array MARY and then is held in the latch circuit FF at a rate of 8 bits. Although not restrictive particularly, an internal address signal (not shown) is supplied to the input-output buffer IOB. In the read mode, the output signal from one unitary sense amplifier circuit designated by the address signal out of the aforementioned 8 unitary sense amplifier circuits is sent to the external terminal D. Meanwhile in the write mode, the write data is fed via the external terminal D to the data line designated by the address signal, and such data is held in the unitary latch circuit coupled to the designated data line. Thus, by changing the address signal, it is rendered possible to read the 8-bit data serially and also to write the 8-bit serial data as mentioned above.

The internal address signals aX and aY fed to the erasing and writing X selection circuits XSEL1, XSEL2 and the Y decoder YDCR are formed via an unshown address buffer which receives address signals AX and AY supplied thereto via the external terminal A. The unshown address buffer forms both an internal address signal aX conforming with the address signal AX and an internal address signal aY conforming with the address signal AY. And the signals aX and aY thus produced are fed to the erasing and writing X selection circuits and the Y decoder. Furthermore, each of the internal address signals formed by the address buffer is partially fed to the input-output buffer IOB as mentioned above. A modification may be so contrived that, although not restrictive particularly, the internal address signal is also fed partially to the flip-flop circuit FF and, in the write mode, a desired one of the unitary flip-flop circuits is selected to perform a data rewriting operation.

The latch circuit FF is disposed above the memory array MARY. Each of the unitary latch circuits constituting such latch circuit FF includes a level converter which produces a voltage such as a writing high voltage $+Vpp$ in accordance with the storage data being held therein and applies the voltage to the corresponding data line in the memory array MARY. And the drain of any MNOS transistor, which need not be written into (with injection of charge) at the time of writing the memory cells, is supplied with such high voltage equivalent to the writing voltage $+Vpp$ applied to the gate of the same transistor, so as to inhibit the writing operation based on the tunnel phenomenon.

The MNOS transistor consists of an insulated gate type field effect transistor having a double-layer gate insulating film composed of a relatively thin silicon oxide film and a relatively thick silicon nitride film formed thereon. This transistor is capable of performing electrical erasure of the stored data as well as a data writing operation. In a state where the data is erased or not written, the threshold voltage of the n-channel type MNOS transistor is maintained at a negative value. For writing or erasing the data, a high-intensity electric field acts on the gate insulating film so as to cause injection of carrier electrons based on the tunnel phenomenon. In this embodiment, the circuit ground potential Vss (0 volt) is fixedly supplied to the well region serving as the substrate gate of the MNOS transistor.

Therefore, in the write mode, a writing-level high voltage $+Vpp$ is applied to the gate electrode correspondingly to the potential of 0 volt at the substrate gate of the MNOS transistor, so as to enable the operation of the X selection circuit XSEL2. Meanwhile, a low voltage substantially equal to the circuit ground potential Vss (0 volt) or the writing-level high voltage $+Vpp$ is applied to the source region and the drain region in accordance with the data to be written. Then, due to the positive high voltage $+Vpp$ applied to the gate electrode, a channel is induced in the channel forming region of the MNOS transistor, i.e. on the surface of the silicon region between the source region and the drain region. The potential of such channel becomes equal to the potential in the source region and the drain region. When a voltage substantially equal to the circuit ground potential Vss (0 volt) is applied to the source region and the drain region as mentioned above, a high-intensity electric field corresponding to the high voltage $+Vpp$ at the gate electrode acts on the gate insulating film. As a result, carrier electrons from the channel are injected into the gate insulating film because of the tunnel phenomenon, whereby the threshold voltage of the MNOS transistor is changed from, for example, a negative level to a positive level.

When the writing-level high voltage $+Vpp$ is applied to the source region and the drain region, the potential difference between the gate electrode and the channel comes to have a small value. Such small potential difference is insufficient for causing the tunneling injection of electrons, so that the threshold voltage of the MNOS transistor remains unchanged. The level converter (not shown) included in the latch circuit FF functions to equalize, to the above-described high voltage +Vpp, the potential of the data line coupled to any memory cell not performing the tunneling injection of electrons, in accordance with the data bit being held in the unitary latch circuit corresponding to the level converter, thereby inhibiting the injection of charge.

Meanwhile in the erase mode, the X selection circuit XSEL1 is enabled to operate. Since the well region serving as the substrate gate of the MNOS transistor is fixed to the ground potential Vss (0 volt) as mentioned above, the X selection circuit XSEL1 applies the negative high voltage −Vpp to the word line coupled to the gate electrode of the MNOS transistor. Consequently the tunnel phenomenon occurs in the reverse direction between the gate electrode and the substrate gate, so that the carrier electrons are returned to the substrate gate to eventually erase the stored data.

The bootstrap circuit (high voltage generator) BST increases the received supply voltage Vcc (e.g. +5 volts) to produce a writing high voltage +Vpp (e.g. +15 volts) or decreases the supply voltage Vcc to produce a negative high voltage −Vpp (e.g. −15 volts). The writing high voltage +Vpp is fed to the writing X selection circuit XSEL1 and the well control circuit CWLC provided for controlling the well region where a switch MOSFET is formed as will be described later.

The control circuit CONT receives external control signals such as a chip enable signal $\overline{CE}$, a write enable signal $\overline{WE}$ and an output enable signal $\overline{OE}$, and produces various control signals to indicate internal operation modes in the EEPROM unit for the bootstrap circuit BST, the selection circuits XSEL1, XSEL2, YSEL, the sense amplifier SA and the input-output buffer IOB. For purposes of drawing simplification, the specific control signals such as WR, WE, R and VE from the control circuit CONT to the controlled circuits are not shown, inasmuch as the control is carried out in accordance with well-known principles.

In FIG. 4, a reference symbol "o" denotes an external terminal provided in the EEPROM unit, and Vss denotes an external terminal for supplying the circuit ground potential Vss to each of the internal circuits in the EEPROM unit.

Figure 1:
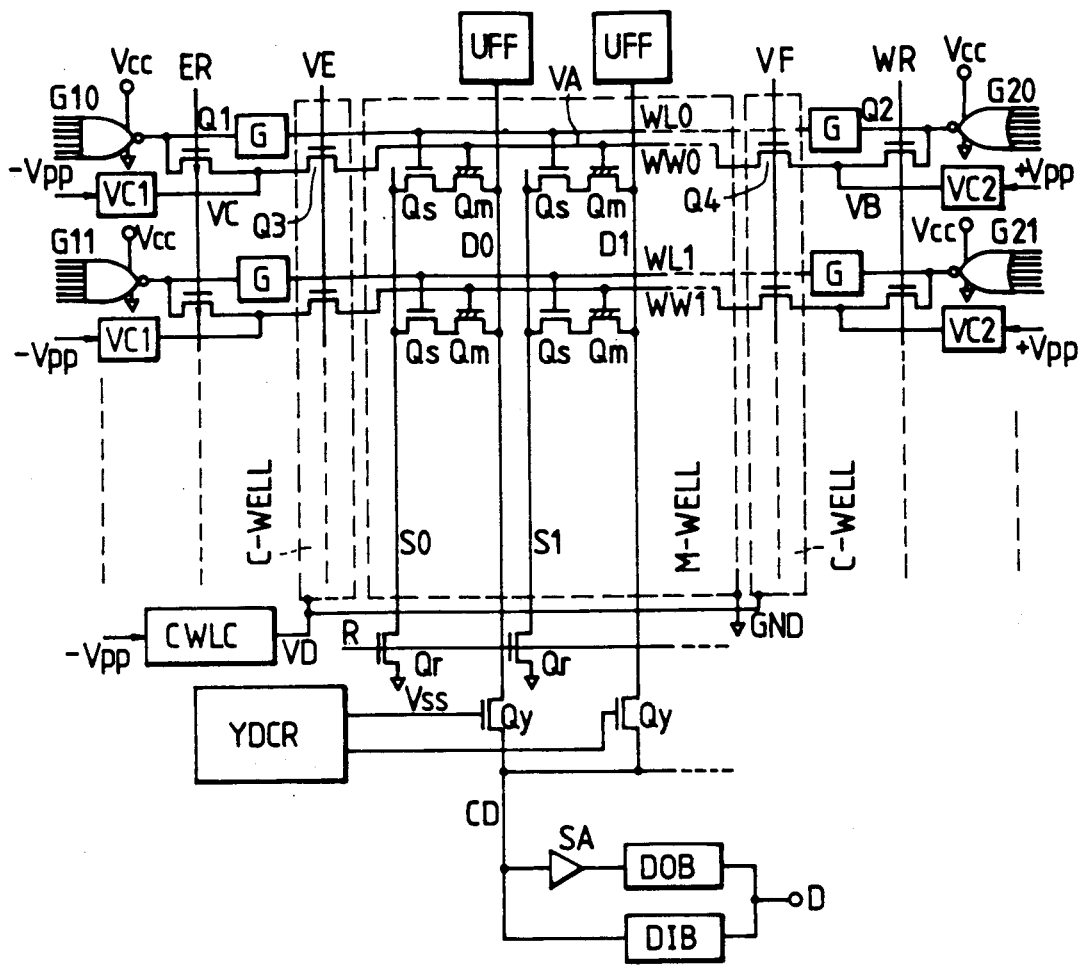
FIG. 1 is a circuit diagram of principal components in an embodiment of the EEPROM unit according to the present invention.

FIG. 1 is a circuit diagram showing specific embodiments of the principal components in the EEPROM unit described above.

Although not restrictive particularly, the EEPROM unit is operated at a relatively low supply voltage Vcc (e.g. +5 volts) obtained from outside, a positive high voltage +Vpp (e.g. +15 volts) and a negative high voltage −Vpp (e.g. −15 volts) produced by the internal bootstrap circuit from the supply voltage Vcc. The X decoders and so forth included in the aforementioned writing and erasing X selection circuits XSEL1 and XSEL2 are constituted of CMOS circuits, although not restrictive particularly. The CMOS circuit performs its operation at a relatively low supply voltage Vcc such as +5 volts. Therefore, the high level of a selection/nonselection signal formed by the address decoder of such CMOS circuit is set substantially to the supply voltage Vcc (+5 volts), while its low level is set substantially to the circuit ground potential Vss (0 volt).

The structure of the component elements constituting the EEPROM unit are summarized as follows, although not illustrated in the diagram as they are not directly concerned with the present invention.

The entirety of the unit shown in the diagram is fabricated on a semiconductor substrate composed of n-type monocrystal silicon. The MNOS transistor is n-channel type and formed in a p-type well region or p-type semiconductor region on the surface of the semiconductor substrate. The n-channel type MOSFET is similarly formed on the p-type semiconductor region, and the p-channel type MOSFET is formed on the semiconductor substrate.

Although not restrictive particularly, each memory cell consists of one MNOS transistor Qm and one address selecting MOSFET Qs connected in series thereto. In one memory cell, the MNOS transistor Qm and the MOSFET Qs are disposed in a stacked gate structure where the gate electrode of the MOSFET Qs partially overlaps the gate electrode of the MNOS transistor Qm. Consequently the size of the memory cell ca be reduced since the MNOS transistor Qm and the MOSFET Qs constituting the memory cell are arranged substantially in an integrated structure.

Although the invention is not limited to this, one example of a stacked memory cell arrangement which could be used is set forth in an article in Nikkei Electronics, Feb. 10, 1986, (No. 388), pp. 142-145, which is hereby incorporated by reference.

Each memory cell is formed in a common well region M-WELL, although not restrictive particularly. In the diagram, the common well region M-WELL is enclosed with a broken line. Meanwhile, the n-channel type MOSFETs used in the CMOS circuits constituting peripheral circuitry such as the X decoder, Y decoder or the like is formed in a p-type well region which is independent of the aforementioned common p-type well region M-WELL for the memory cell.

In this structure, the n-type semiconductor substrate has a common substrate gate for a plurality of p-channel type MOSFETs formed thereon, and is maintained at the level of the supply voltage Vcc. And the well region, where the substrate gate of the n-channel type MOSFET constituting the CMOS circuit is existent, is maintained at the circuit ground potential Vss (0 volt).

In FIG. 1, the memory array MARY includes a plurality of memory cells arranged in the shape of a matrix. This diagram shows an example comprising a total of 4 memory cells disposed in 2 rows and 2 columns. Of course, it is understood that typically many rows and columns would be provided, and the present invention is not limited to a particular size of memory array. Each memory cell consists of one MNOS transistor Qm and one address selecting switch MOSFET Qs interposed between the source of the MNOS transistor Qm and a common source line S0 (S1, etc.). The drain of the MNOS transistor Qm is coupled to the data line (bit line or digit line) D0 (D1, etc.). In case the aforementioned stacked gate structure is adopted, the channel forming region of the MOSFET Qs is directly adjacent to the channel forming region of the MNOS transistor Qm. Therefore it is to be understood that, with regard to the MNOS transistor Qm, the term "source" mentioned above is used merely for convenience.

The gates of the address selecting MOSFETs Qs in the individual memory cells arranged on the same row are connected in common to a first word line WL0, and the gates of the MNOS transistors Qm corresponding thereto are connected in common to a second word line WW0. Similarly, with regard to another row shown as a typical example in the diagram, the gates of the address selecting MOSFETs and those of the MNOS transistors in the individual memory cells arranged on the same row are connected in common to a first word line WL1 and a second word line WW1, respectively.

The drains of the MNOS transistors Qm in the individual memory cells arranged on the same column are connected in common to a data line D0. Similarly, with regard to the memory cells arranged on another same row shown as a typical example in the diagram, the drains of the MNOS transistors Qm in the individual memory cells are connected in common to a data line D1. Source lines S0 and S1 are disposed in parallel with the data lines D0 and D1, and each of the aforementioned address selecting MOSFETs Qs is provided between the MNOS transistor Qm and the source line. Such source lines S0, S1 and so forth are supplied with the circuit ground potential Vss (0 volt) via the switch MOSFETs Qr which are turned on in the read mode.

In the diagram, the writing X selection circuit XSEL2 is disposed at the right ends of the word lines WL and WW. The writing X selection circuit is constituted of a plurality of unitary X selection circuits having the same configuration respectively, and the unitary X selection circuits are mutually opposed with respect to each row. That is, one unitary X selection circuit is provided for one row (having the first word line and the second word line opposed thereto).

Now a description will be given on one of such unitary X selection circuits related to one row (having the first word line WL0) and the second word line WW0). This unitary X selection circuit comprises a NOR gate circuit G20 constituting a unitary decoder circuit, a gate circuit G, switch MOSFETs Q2, Q4 and a level converter circuit VC2. The gate circuit G receives both a decode output signal from the unitary decoder circuit and an unshown control signal from the control circuit CONT, then produces a substantial selection/non-selection signal in accordance with each operation mode, and supplies the signal thus produced to the first word line WL0. The level converter circuit VC2 receives both the decode output signal via the switch MOSFET Q2 and the high voltage +Vpp, and produces a writing high voltage +Vpp to be supplied to the second word line WW0. The writing high voltage +Vpp thus obtained is fed via the switch MOSFET Q4 to the second word line WW0.

The other unitary X selection circuits have the same configuration as that of the above-described unitary X selection circuit. However, the combinations of internal X address signals (not shown) supplied to the unitary decoder circuits in each unitary X selection circuit are different from one another. Accordingly, in the write mode, merely one unitary decoder circuit conforming with the external address signal AX supplied from outside functions to produce a high-level decode output signal, while each of the remaining unitary decoder circuits produce a low-level decode output signal.

As described above, the decoder in this embodiment is composed of CMOS circuits. Therefore, each of the unitary decoder circuits constituting the decoder is energized with both the supply voltage Vcc and the circuit ground potential Vss a shown in the diagram, so that the aforementioned high level becomes substantially equal to the supply voltage Vcc and the aforementioned low level becomes substantially equal to the circuit ground potential Vss.

The switch MOSFET Q4 for coupling the output of the level converter circuit VC2 to the second word line WW0 is composed of an n-channel type MOSFET, and the similar switch MOSFETs provided for each of the other rows are also each composed of an n-channel type MOSFET. Such switch MOSFETs are preferably all formed together in a single independent well region C-WELL (enclosed with a broken line in the diagram) so that the switching action thereof can be executed under control.

The erasing X selection circuit XSEL 1 is disposed at the left ends of the word lines WL and WW in the diagram, although not restrictive particularly. And similarly to the aforementioned writing X selection circuit XSEL2, the erasing X selection circuit is constituted of a plurality of unitary X selection circuits having the same configuration respectively, and the unitary X selection circuits are mutually opposed with respect to each row (having the first word line and the second word line opposed thereto).

Describing one of such unitary X selection circuits related to one row (having the first word line WL0 and the second word line WW0), this unitary X selection circuit comprises, similarly to the aforementioned example, a NAND gate circuit G10 constituting a unitary decoder circuit, a gate circuit G, switch MOSFETs Q1, Q3 and a level converter circuit VC1. The gate circuit G receives both a decode output signal from the unitary decoder circuit and a control signal (not shown) from the control circuit CONT, then produces a substantial selection/non-selection signal in accordance with each operation mode, and supplies the signal thus produced to the first word line WL0. The level converter circuit VC1 receives both the decode output signal via the switch MOSFET Q1 and the high voltage −Vpp, and produces an erasing negative high voltage −Vpp to be supplied to the second word line WW0. The erasing negative high voltage −Vpp thus obtained is fed via the switch MOSFET Q3 to the second word line WW0.

As mentioned above, the remaining unitary X selection circuits have the same configuration as that of the above-described unitary circuit. However, the combinations of internal X address signals (not shown) supplied to the unitary decoder circuits in each unitary X selection circuit are different from one another. Each of such unitary decoder circuits is composed of a CMOS circuit and is energized with both the supply voltage Vcc and the circuit ground potential Vss similarly to the aforementioned example. Consequently, the high level of the decode output signal becomes substantially equal to the supply voltage Vcc, and the low level thereof becomes substantially equal to the circuit ground potential Vss.

The switch MOSFET Q3 for coupling the output of the level converter circuit VC1 to the word line WW0 is composed of an n-channel type MOSFET, and similar switch MOSFETs provided for the other rows are each also composed of an n-channel type MOSFET. Such switch MOSFETs Q3 are preferably all formed together in a single independent well region C-WELL (enclosed with a broken line in the diagram).

In this embodiment where the constitution adopted is such that the erasing and writing X selection circuits XSEL1 and XSEL2 are disposed separately at the two ends of the word lines, two decoder circuits of the same configuration are required and therefore may be considered to bring about some waste due to the duplication. However, since a plurality of word lines are arranged at a high density on the semiconductor chip so as to attain a high integration density, it is preferred that the respective circuits be disposed separately at the two ends of the word lines for forming the erasing and writing level converter circuits, switch MOSFETs Q3, Q4 and so forth in conformity with the pitch of the word lines. Such configuration is effective for realizing a high density of the word lines to consequently accomplish a great storage capacity.

The common data line CD connected to the individual data lines D0 and D1 via column switch MOSFETs Qy is coupled to the output circuit of a data input circuit DIB constituting an input-output circuit IOB and also to the input terminal of a data output circuit comprising a sense amplifier SA and an output buffer circuit DOB. The input terminal of the data input circuit DIB and the output terminal of the data output circuit are coupled to the aforementioned external terminal D.

According to this embodiment, a unitary latch circuit UFF for holding the preceding data stored in the memory cell prior to an erasing or writing operation is provided on each of the data lines D0 and D1 illustrated as a typical example in the diagram. The unitary latch circuit UFF is equipped with, although not shown, a level converter for selectively writing data (with injection of electrons). The level converter functions, in the write mode, to convert the potential of the data line to either the ground potential Vss (0 volt) or the high voltage +Vpp selectively in accordance with the storage data in the related unitary latch circuit UFF.

Figure 2:
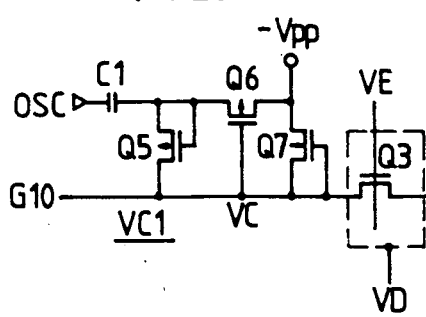
FIG. 2 is a circuit diagram of an exemplary level converter for producing an erasing high voltage $-Vpp$.

FIG. 2 is a circuit diagram of an exemplary level converter VC1 (charge pump circuit) for producing the erasing high voltage mentioned above.

In the erase mode, a switch MOSFET Q1 is turned on by an internal erasing signal ER (see FIG. 1). And a decode signal obtained from a unitary decoder circuit G10 via the switch MOSFET Q1 is supplied to the gate of a p-channel MOSFET Q6. Meanwhile a pulse signal OSC is supplied via a capacitor C1 to another electrode (source or drain) of such MOSFET Q6. This signal OSC can be provided by a separate oscillator circuit or from the oscillator OSC of FIG. 5 (to be described later). There is provided, between another electrode (source or drain) of the MOSFET Q6 and the output node of the unitary decoder circuit G10, a diode-like p-channel type MOSFET Q5 which causes the flow of a current from the unitary decoder circuit G10 toward the pulse signal OSC. (The MOSFET Q5 can be regarded as a diode where its anode is connected to the output node of the unitary decoder circuit G10 while its cathode is connected to another electrode of the MOSFET Q6.) The remaining electrode (drain or source) of the MOSFET Q6 is connected to the negative high voltage $-$Vpp. And between the high voltage $-$Vpp and the output node of the unitary decoder circuit G10, there is provided a diode-like p-channel type MOSFET Q7 which causes the flow of a current from the high voltage $-$Vpp toward the unitary decoder circuit G10. (The MOSFET Q7 can be regarded as a diode where its anode is connected to the high voltage $-$Vpp while its cathode is connected to the unitary decoder circuit G10.)

The level converter in this embodiment performs the following operation. When the decode output signal from the unitary decoder circuit G10 has a low level such as the circuit ground potential Vcc, the p-channel type MOSFET Q6 is kept in its on-state. Accordingly, if the pulse signal OSC has a high level such as +5 volts, the capacitor C1 is charged up to +5 V$-$V$_{thp}$ (where V$_{thp}$ is the threshold voltage of MOSFET Q6). When the pulse signal OSC is changed to a low level such as the circuit ground potential Vss, the diode-like MOSFET Q5 is turned on so that the potential at the node VC is lowered to a negative value as $-5$ V+2V$_{thp}$ (where 2V$_{thp}$ is the combined threshold voltage of MOSFETs Q5 and Q6). Therefore, if the pulse signal OSC is again turned to a high level, the capacitor C1 is charged up to a higher voltage as +5 V+5 V$-$3V$_{thp}$ since the potential at the node VC is a negative voltage such as $-5$ V+2V$_{thp}$. Consequently, when the pulse signal OSC is turned again to a low level, the potential at the node VC is changed to a greater value of $-(10$ V$-$4V$_{thp})$. Due to repetition of such operation, the potential at the node VC finally becomes a voltage of $-$Vpp$-$V$_{thp}$, where V$_{thp}$ is the threshold voltage of the MOSFET Q7. Thus, the MOSFET Q7 functions as a level limiter.

Such negative high voltage $-$Vpp$-$V$_{thp}$ is fed to the second word line WW0 via the switch MOSFET Q3 which is turned on by the signal VE in the erase mode. In this stage of the operation, the low-level internal erasing signal ER is supplied to the gate of the p-channel type MOSFET Q1, and the low-level output signal of the unitary decoder circuit G10 is supplied to another electrode of the MOSFET Q1. Therefore the negative high voltage $-$Vpp$-$V$_{thp}$ at the node VC is not fed to the unitary decoder circuit G10.

When the decode output signal of the unitary decoder circuit G10 has a high level such as +5 volts, the p-channel type MOSFET Q6 is turned off to consequently maintain the decode output signal of the unitary decoder circuit G10 at a high level.

Figure 3:
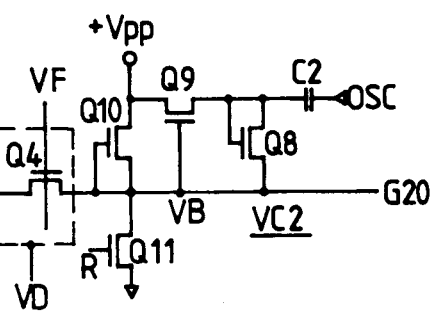
FIG. 3 is a circuit diagram of an exemplary level converter for producing a writing high voltage $+Vpp$.

FIG. 3 is a circuit diagram of an exemplary level converter VC2 (charge pump circuit) for producing the afore-said writing high voltage.

In the write mode, a switch MOSFET Q2 is turned on by an internal write signal WR (see FIG. 1). And the decode output signal of a unitary decoder circuit G20 is supplied via the switch MOSFET Q2 to the gate of an n-channel type MOSFET Q9. Meanwhile a pulse signal OSC is supplied to another electrode (source or drain) of such MOSFET Q9 via a capacitor C2. There is provided, between another electrode (source or drain) of the MOSFET Q9 and the unitary decoder circuit G20, a diode-like n-channel type MOSFET Q8 which causes the flow of a current toward the unitary decoder circuit G20. The remaining electrode (drain or source) of the MOSFET Q9 is connected to the positive high voltage +Vpp. And between the high voltage +Vpp and the unitary decoder circuit G20, there is provided a diode-like n-channel type MOSFET Q10 which causes flow of a current toward the high voltage +Vpp.

The level converter in this embodiment performs the following operation. When the decode output signal from the unitary decoder circuit G20 has a high level such as the supply voltage Vcc, the p-channel type MOSFET Q9 is kept in its on-state. Accordingly, if the pulse signal OSC has a low level such as 0 volt, the capacitor C2 is charged up to +5V$-$V$_{thn}$ (where V$_{thn}$ is the threshold voltage of MOSFET Q9). When the pulse signal OSC is changed to a high level such as the supply voltage Vcc, the diode-like MOSFET Q8 is turned on by the bootstrap action of the capacitor C2, so that the potential at the node VB is raised to a high voltage of +10V$-$2V$_{thn}$ (where 2V$_{thn}$ is the combined threshold voltage of MOSFET Q9). Therefore, if the pulse signal OSC is again turned to a low level, the capacitor C2 is charged up to a higher voltage as +10V$-$3V$_{thn}$ since the potential at the node VB is a high voltage as +10V$-$2V$_{thn}$. Consequently, when the pulse signal OSC is turned again to a high level, the potential at the node VB is changed to a greater value of $-(15V-4V_{thp})$. Due to repetition of such operation, the potential at the node VB finally becomes a voltage of $+Vpp+V_{thn}$, where $V_{thn}$ is the threshold voltage of the MOSFET Q10. Thus, the MOSFET Q10 functions as a level limiter.

Such positive high voltage $+Vpp+V_{thp}$ is fed to the second word line WW0 via the switch MOSFET Q4 which is turned on by the signal VF in the write mode. In this stage of the operation, the high-level internal write signal WR is supplied to the gate of the n-channel type MOSFET Q2, and the high-level decode output signal of the unitary decoder circuit G20 is supplied to another electrode of the n-channel type MOSFET Q2. Therefore the positive high voltage $+Vpp+V_{thp}$ at the node VB is not fed to the unitary decoder circuit G20.

When the decode output signal of the unitary decoder circuit G20 has a low level such as 0 volt, the n-channel type MOSFET Q9 is turned off to consequently maintain the decode output signal of the unitary decoder circuit G20 at a low level.

The MOSFET Q11 is turned on by a read control signal R, so that the potential at the second word line WW is set to the ground potential in the read mode.

Figure 5:
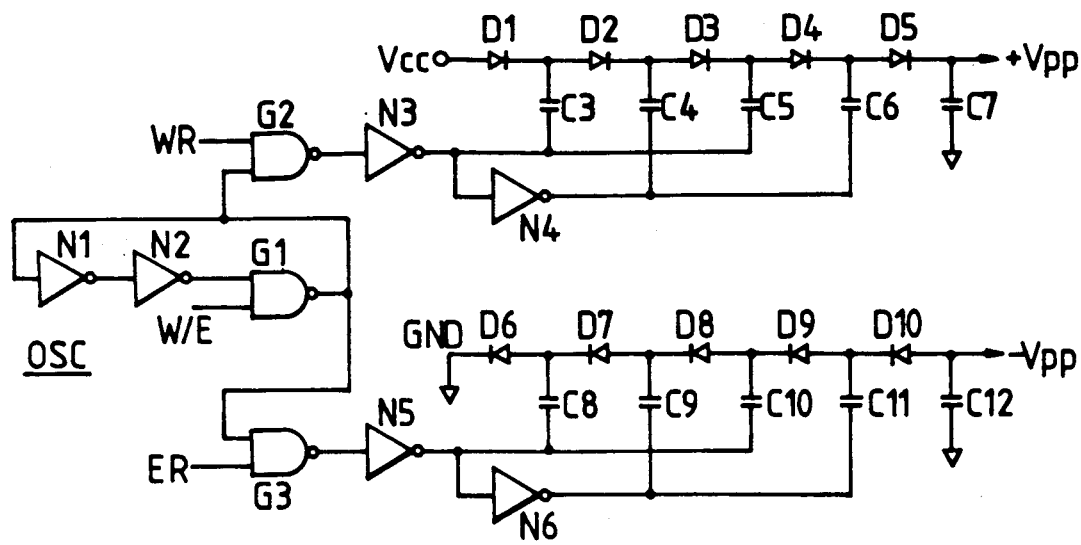
FIG. 5 is a specific circuit diagram showing an exemplary bootstrap circuit.

FIG. 5 is a specific circuit diagram showing an embodiment of the aforementioned bootstrap circuit BST for providing the high voltage signals $-Vpp$ and $+Vpp$ to the various elements such as XSEL1, XSEL2 and the latch FF (e.g. see FIG. 4).

Inverter circuits N1, N2 and a NAND gate circuit G1 are mutually connected in the shape of a ring to constitute a ring oscillator. In this embodiment, a write/erase signal W/E from the control circuit CONT is turned to logic "1" merely in the write or erase mode for the purpose of reducing the power consumption, thereby enabling the NOR gate circuit G1 to function substantially as an inverter circuit for oscillation. In the read mode or standby mode, the write/erase signal W/E is turned to logic "0", so that the output signal of the NAND gate circuit G1 is fixedly retained at logic "1" to halt the oscillation.

The bootstrap circuit for producing a writing high voltage $+Vpp$ utilizes a pulse signal which is based on the aforesaid oscillation signal received in the write mode via a NAND gate circuit G2 opened by an internal write signal WR. That is, in the write mode, a pulse signal is outputted from the NAND gate circuit G2 and then is processed via inverter circuits N3 and N4, so that the output signals therefrom are mutually opposite in phase.

Diodes (or diode-like MOSFETs) D1 through D5 and capacitors C3 through C6 are connected in the shape of a ladder, and the pulse signals of mutually opposite phases obtained from the inverter circuits N3 and N4 are supplied alternately to the capacitors C3 and C6, thereby producing a boosted voltage $+Vpp$, which is higher than the supply voltage Vcc, by a charge pump action similar to that of the aforementioned level converters. The boosted voltage $+Vpp$ thus obtained is held in an output capacitor C7.

The bootstrap (stepdown) circuit for producing an erasing high voltage $-Vpp$ utilizes a pulse signal which is based on the aforementioned oscillation signal received in the erase mode via a NAND gate circuit G3 opened by an internal erase signal ER. That is, in the erase mode, a pulse signal outputted from the NAND gate circuit G3 is processed via inverter circuits N5 and N6, so that the output signals therefrom are mutually opposite in phase.

Diodes D6 through D10 and capacitors C8 through C12 are connected in the shape of a ladder, and the pulse signals of mutually opposite phases obtained from the inverter circuits N5 and N6 are supplied alternately to the capacitors C8 through C11. Since the diodes are directionally reverse to the foregoing case of producing a positive high voltage $+Vpp$, there is generated a negative high voltage $-Vpp$, which is below the ground potential (0 volt), by a charge pump action similar to that of the aforementioned level converters. The high voltage $-Vpp$ thus obtained is held in an output capacitor C12.

Referring again to FIG. 1, memory array MARY in this embodiment is driven substantially by the following potentials.

First in the read mode, the switch MOSFET Qr is turned on by a high-level read signal R, so that the circuit ground potential Vss is supplied to the common source lines S0, S1 and so forth of the individual columns. The second word lines WW0, WW1 and so forth coupled to the gate electrodes of the MNOS transistors Qm are set substantially at the ground potential Vss, i.e. the intermediate voltage between the high threshold voltage (positive) and the low threshold voltage (negative) of the MNOS transistors, since the MOSFETs Q11 and so forth provided in the level converter circuit VC2 of FIG. 3 are turned on by the high-level read signal R. The first word line to be selected out of the word lines WL0, WL1 and so forth is set by the gate circuit G at a selection level or a high level substantially equal to the supply voltage Vcc, while the remaining or non-selected word lines are retained at a non-selection level or a low level substantially equal to the ground potential Vss. Such word line selection and non-selection levels are determined by the two X selection circuits XSEL1 and XSEL2. Accordingly, despite a great load capacity existing due to the connection of multiple switch MOSFETs Qs to the word lines, the selected word line is driven by the two gate circuits G, so that the word line selection can be executed at a high speed. Such constitution may be so modified as to operate merely one of the X selection circuits XSEL1 and XSEL2. In this case, the power consumption can be further reduced.

The data line to be selected out of the lines D0 through D1 is supplied with a sense current from a sense amplifier SA which will be described later. For example, if the MNOS transistor Qm in the memory cell selected by the word line WL0 has a low threshold voltage, the memory cell forms a current path for the relevant data line coupled thereto. Meanwhile, if the MNOS transistor Qm in the selected memory cell has a high threshold voltage, the memory cell does not form a current path substantially. Therefore, reading out the data from the memory cell is carried out by detection as to whether such sense current flows or not.

In the write mode where the well region M-WELL is retained fixedly at the circuit ground potential Vss as mentioned, the second word line WW0 to be written is supplied with a high voltage such as $+Vpp$. Accordingly the signal VF is turned to a high level such as the voltage $+Vpp$ to consequently turn on the switch MOSFET Q4. In such a write mode, the switch MOSFET Qr is turned off in response to the change of the read signal R to its low level. The first word lines WL0, WL1 and so forth are set by the gate circuit G at a non-selection level or a low level substantially equal to the ground potential. With the exception of one second word line WW0 coupled to the memory cell where the data is to be written, the remaining second word lines are retained at a low level such as the circuit ground potential. Meanwhile, in accordance with the data to be written in the memory cell, the relevant one of the data lines D0 through D1 is set at a low level substantially equal to the ground potential Vss or at a high level close to the high voltage +Vpp by the unitary latch circuit UFF provided on such data line.

In the write mode, the signal VE is turned to a low level such as the ground potential, while the MOSFET Q3 and so forth are turned off. Therefore the well region C-WELL, where the switch MOSFETs Q3 and Q4 are existent, is set at a low-level potential such as the ground potential Vss.

In the erase mode, the well region M-WELL is retained fixedly at the ground potential Vss as mentioned above, so that fundamentally the first word lines WL0 through WL1 and the second word lines WW0 through WW1 are set at a level substantially equal to the negative high voltage −Vpp for erasure. However, according to this embodiment, the levels of the word lines WL and WW are so determined as to enable erasure of the memory cells in the individual memory row, although not restrictive particularly. The second word line WW0 relative to the memory row to be erased out of the word lines WW0 through WW1 is set at an erase level by the application of a voltage substantially equal to the negative high voltage −Vpp obtained from the aforementioned level converter circuit VC1. Meanwhile, the second word line WW1 relative to the memory row not to be erased is set at a non-erase level substantially equal to the supply voltage Vcc. In this stage of the operation, the switch MOSFET Q3 is turned on in accordance with change of the signal VE to the high level (Vcc) or the ground potential (0 volt), and the erase level generated by the level converter circuit VC1 is fed to the second word line WW. Then the signal VF is turned to a negative potential such as the voltage −Vpp, whereby the switch MOSFET Q4 is turned off. Consequently the potential in the well region C-WELL is retained at a negative high voltage such as −Vpp through the well control circuit CWLC.

The signals in the above operations and the potentials at the individual nodes are listed in Table 1 below.

TABLE 1

| VA | VB | VC | VD | VE | VF |
|---|---|---|---|---|---|
| Write | | | | | |
| +Vpp | +Vpp | 0 V | 0 V | 0 V | +Vpp |
| Erase | | | | | |
| −Vpp | 0 V | −Vpp | −Vpp | 0 V | −Vpp |

Regarding the values given in Table 1, as well as at other areas in the specification, it is to be noted that for purposes of simplification the various transistor threshold values are not included. The threshold values are discussed in the detailed discussion of the level converters VC1 and VC2 regarding FIGS. 2 and 3.

As shown in FIG. 1, VA stands for the potential of the second word line WW to be written or erased; VB for the output potential of the level converter circuit VC2; VC for the output potential of the level converter circuit VC1; VD for the potential of the well region C-WELL where the switch MOSFETs Q3 and Q4 exist; and VE, VF for the potentials of the control signals supplied to the gates of the switch MOSFETs Q3, Q4, respectively. The potential VE may be either 0 volt as shown in Table 1 or a high level such as Vcc in the erase mode as mentioned.

Figure 6:
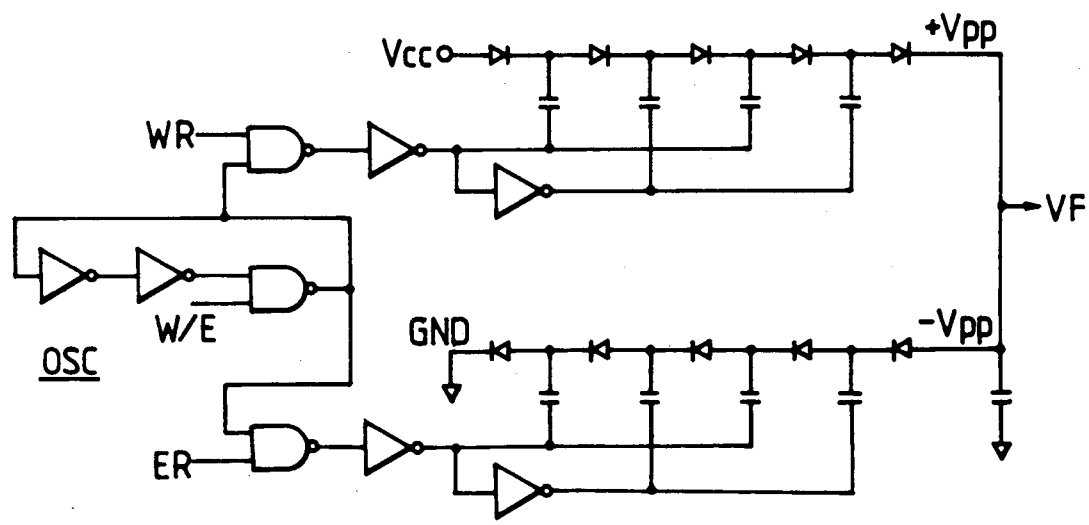
FIG. 6 is a circuit diagram of an exemplary voltage generator for forming a signal VF shown in FIG. 1.

FIG. 6 is a circuit diagram of an exemplary voltage generator for producing the aforesaid signal VF. It is necessary that the signal VF be switched to a positive high voltage +Vpp in the write mode or to a negative high voltage −Vpp in the erase mode. In this embodiment, the bootstrap circuit shown in FIG. 5 may be utilized for the purpose mentioned. However, since the signal VF is supplied to a switch MOSFET such as Q4, its load capacity becomes relatively small. Accordingly, although the circuit constitution is similar to that of FIG. 5, the sizes of the component elements and capacitors can be considerably reduced. The operation itself is substantially the same as that of the bootstrap circuit shown in FIG. 5. That is, the signal VF is turned to a positive high level such as +Vpp by the signal WR in the write mode or to a negative high level such as −Vpp by the signal ER in the erase mode. In a modification, the oscillator circuit OSC and the gate circuits to receive the signals WR and ER respectively may be replaced with those shown in FIG. 5. In the read mode, the signal VF needs to be turned to a high level such as Vcc for applying the ground potential Vcc from the level converter circuit VC2 to the second word line WW0 by turning on the switch MOSFET Q4. Therefore, an unshown circuit function is additionally provided for turning the signal VF to a high level such as Vcc in the read mode.

According to this embodiment, the constitution is so contrived that the potential is retained at a fixed value in the well region M-WELL where many MNOS transistors are existent, i.e. in the substrate gates of the MNOS transistors Qm, and the storage data of each MNOS transistor is erased by applying a negative high voltage to the second word line to which the gate of the relevant MNOS transistor is coupled.

In this constitution, the load driven by the high voltage +Vpp or −Vpp generated from the bootstrap circuit BST has a relatively small parasitic capacitance in the well region C-WELL which is extremely smaller than the well region M-WELL where the second word lines WW and the memory cells are existent, so that the current required for driving such load by the well control circuit CWLC can be sufficiently diminished. Thus, it becomes possible to realize dimensional reduction of the component elements shown in FIG. 5, such as inverter circuits N3 through N6, diodes D1 through D10 and capacitors C3 through C12.

Although not restrictive particularly, the read mode is indicated by the respective low level, low level and high level of signals at external terminals $\overline{CE}$, $\overline{WE}$ and $\overline{OE}$ (hereinafter referred to as signals $\overline{CE}$, $\overline{WE}$, $\overline{OE}$); and the standby mode is indicated by the high level of a signal $\overline{CE}$. The first write mode is indicated in the case where the signal $\overline{CE}$ is set at low level, the signal $\overline{OE}$ is set at high level and the signal $\overline{WE}$ is changed from high (low) level to low (high) level. That is, in the first write mode, an operation for writing the data of the memory cells into the latch circuit is indicated in the case where the signal $\overline{CE}$ is low level, the signal $\overline{OE}$ is high level and the signal $\overline{WE}$ is changed from high level to low level. On the other hand, an operation for writing the external data to be written into the latch circuit is indicated in the case where the signal $\overline{CE}$ is low level, the signal $\overline{OE}$ is high level and the signal $\overline{WE}$ is changed from low level to high level. The second write mode for writing the data in the memory cell is indicated by $\overline{CE}$ being set at low level, $\overline{OE}$ being set at high level and $\overline{WE}$ being set at high level for a predetermined time. Meanwhile, the erase mode is indicated merely for a predetermined time when the second write mode is indicated. The aforementioned signals WR, ER, W/E, R and VE are formed by the control circuit CONT in response to the signals supplied via the external terminals.

Figure 7:
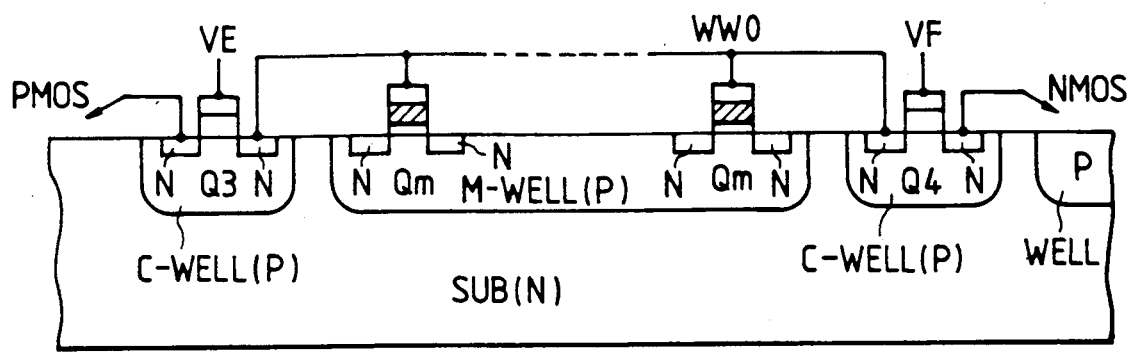
FIG. 7 is a sectional view of principal elements in an embodiment of the EEPROM unit according to the invention.

FIG. 7 is a schematic sectional view of principal component elements in an exemplary embodiment of the EEPROM unit according to the present invention.

In this embodiment, an n-type semiconductor substrate SUB is used as described, and p-channel MOSFETs constituting peripheral circuits are formed on the n-type substrate SUB. MNOS transistors Qm and so forth constituting the aforementioned memory array MARY are formed on a p-type memory well region M-WELL. And switch MOSFETs Q3 and so forth serving to feed the erasing voltage −Vpp to the second word lines WW0 and so forth are formed on an independent well region C-WELL. In this structure, the control voltage VE is supplied to the gates of the switch MOSFETs Q3. The switch MOSFETs Q4 for feeding the writing voltage +Vpp to the second word lines WW0 and so forth are formed on another independent well region C-WELL. Control voltage VF is supplied to the gates of such MOSFETs Q4. And the control voltage VD changed to either 0 volt or −Vpp in accordance with the operation mode is supplied to each of the C-WELL regions mentioned.

The functional effects attained in the above embodiment are as follows:

(1) Level conversion is executed with regard to a writing high voltage of one polarity and an erasing high voltage of another polarity in such a manner that the desired high voltage is outputted selectively in response to the output signal of the X decoder in conformity with the write or erase operation mode, and the selected high voltage is fed via the switch MOSFET to the word line where the gate of the non-volatile memory element is coupled. And the potential of the well region C-WELL, where the switch MOSFET is existent, is changed in accordance with the switching action for controlling the switch MOSFET, whereby the potential of the well region N-WELL with the non-volatile memory element can be fixedly retained. Since the high voltage generator is required merely to drive the parasitic capacitance of the small well region C-WELL where the selected word line and switch MOSFET are existent, it becomes possible to reduce the requisite current supply capacity of the high voltage generator such as the bootstrap circuit BST. Consequently, the circuit elements for producing such high voltage can be dimensionally diminished to attain a remarkable effect of realizing a great storage capacity.

(2) Since the load capacity to be driven is reducible as mentioned, there is achievable an effect of accomplishing smaller power consumption and a higher operation speed.

Although the present invention has been described hereinabove specifically with reference to exemplary embodiments thereof, it is to be understood that the invention is not limited to such embodiments alone, and a variety of modifications may be contrived within the scope not departing from the concept and spirit thereof. For example, in the memory cell, switch MOSFETs may be provided on both the source side and the drain side of the MNOS transistor. In this case, the common source line is omissible. If two MOSFETs are provided on the two sides of the MNOS transistor as in this modification, the memory cell can still be shaped small by utilizing a stacked gate structure.

Figure 8:
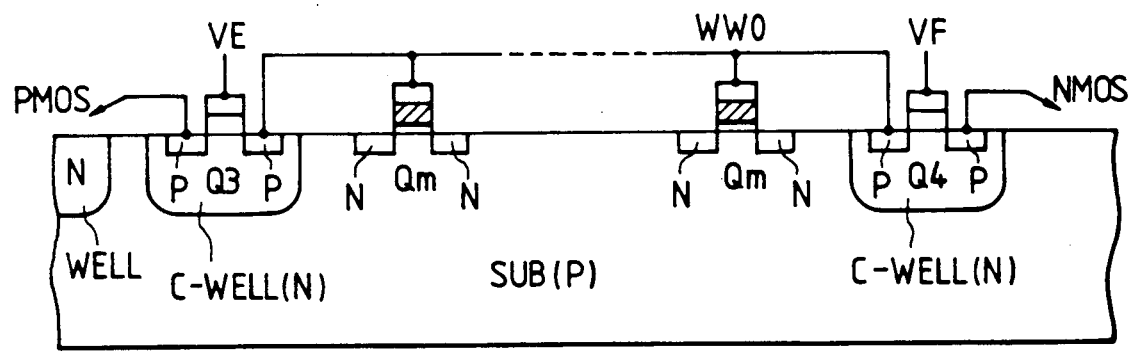
FIG. 8 is a sectional view of principal elements in another embodiment of the EEPROM unit according to the invention.

The circuit for producing the control voltage VF may be formed into any of various configurations in addition to the example of FIG. 6. For example, a circuit could be used that selectively generates a negative voltage −Vpp or a positive voltage +Vpp by employing the level converter circuits VC1 and VC2 shown in FIGS. 2 and 3. In another modification, as shown in FIG. 8, MNOS transistors Qm and switch MOSFETs Qs (not shown) constituting a memory array are formed on a p-type semiconductor substrate SUB, or n-channel type MOSFETs constituting CMOS circuits are formed on such substrate. And a p-channel type MOSFET is used as the switch MOSFET Q3 for feeding an erasing voltage −Vpp to the second word line WW0 or as the switch MOSFET Q4 for feeding a writing voltage +Vpp thereto, and such p-channel MOSFET is formed on an n-type well region C-WELL. The control signals VE and VF supplied to the gates of the switch MOSFETs Q3 and Q4, and also the bias voltage VD supplied to the n-type well region C-WELL, are so formed as to have reverse polarities with respect to those shown in the embodiment of FIG. 7. For example, in the erase mode, the bias voltage VD is set to +Vpp instead of −Vpp.

When no latch circuit is provided on the data line, either the high voltage conforming with the write data or the ground potential may be supplied to the selected data line via the column switch. In this case, the potential of the non-selected data line may be set at a high voltage sufficient to inhibit the writing. The memory element, which is electrically writable and erasable, may be of FLOTOX (floating gate tunnel oxide) type as well. In case such a memory element is employed, a control voltage conforming with the write or erase mode is supplied.

In the embodiment shown in FIG. 1, although not restrictive particularly, the unitary decoder circuits G10, G11 and so forth provided to selectively perform erasing operation are composed of NAND gate circuits, and the unitary decoder circuits G20, G21 and so forth provided to selectively perform writing operation are composed of NOR gate circuits. Therefore, mutually complementary internal address signals are supplied to the unitary decoder circuits G20 and G10 (G21 and G11) corresponding to each other. For example, when internal address signals aX1, aX2, aX3 are supplied to the unitary decoder circuit G20, internal address signals $\overline{aX1}$, $\overline{aX2}$, $\overline{aX3}$ having inverted phases with respect to the foregoing address signals are supplied to the unitary decoder circuit G10 corresponding to the decoder circuit G20. As a result, out of the entire unitary decoder circuits G10, G11 and so forth, a single unitary decoder circuit conforming with the external address signal AX produces a low-level decode output signal, while the remaining unitary decoder circuits produce high-level decode output signals. Furthermore, out of the entire unitary decoder circuits G20, G21 and so forth, a single unitary decoder circuit conforming with the external address signal AX produces a high-level decode output signal, while the remaining unitary decoder circuits produce low-level decode output signals. In the read mode, the gate circuits G to receive the decode output signals of the unitary decoder circuits G10, G11 and so forth invert the phases of such decode output signals in response to the aforementioned read signal R and feed the phase-inverted signals to the first word lines WL0, WL1 and so forth. Meanwhile the gate circuits G to receive the decode output signals of the unitary decoder circuits G20, G21 and so forth directly feed the received decode output signals to the first word lines WL0, WL1 and so forth in response to the signal R. And in the write mode, both of such gate circuits G function in response to the internal write signal WR and feed the circuit ground potential Vss to the first word lines WL0, WL1 and so forth, although not restrictive particularly.

However, the respective constitutions of the unitary decoder circuits and the gate circuits G may be altered into a variety of modifications.

Furthermore, the pulse signal OSC shown in FIGS. 2 and 3 may be replaced with, for example, the output signal of the oscillator circuit OSC in FIG. 5 or the output signal of the gate circuit G1 shown therein.

In addition, the well control circuit CWLC may be composed of, for example, a first switch circuit for feeding, the negative high voltage −Vpp to the well region C-WELL in response to the internal erase signal ER, and a second switch circuit for feeding the circuit ground potential Vss to the well region C-WELL in response to the internal write signal WR. However, such well control circuit CWLC may be altered into any other suitable constitution. It is also possible to form the aforementioned switch MOSFETs Q3 and Q4 in a common well region.

It is to be understood that the EEPROM unit described above may be incorporated in a semiconductor integrated-circuit device such as a single-chip microcomputer.

The present invention is widely utilizable for any EEPROM system where an erasing operation can be performed electrically.

The effects attained by the typical inventive features disclosed in the present application will now be briefly described below. With regard to a writing high voltage of one polarity and an erasing high voltage of another polarity, level conversion is executed in such a manner that the desired high voltage is outputted selectively in response to the output signal of the X decoder in conformity with the write or erase operation mode, and the selected high voltage is fed via the switch MOSFET to the word line to which the gate of the non-volatile memory element is coupled. And the potential of the well region C-WELL, where the switch MOSFET is existent, is changed in accordance with the switching action for controlling the switch MOSFET, whereby the potential of the well region N-WELL with the non-volatile memory element can be fixedly retained. Since the high voltage generator is required merely to drive the well region C-WELL of a small parasitic capacitance where the selected word line and switch MOSFET are existent, it becomes possible to reduce the requisite current supply capability of the high voltage generator. Consequently, the circuit elements for producing such high voltage can be dimensionally diminished to attain an advantageous effect of realizing a great storage capacity.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor memory device comprising:
   a plurality of memory elements each having a substrate gate supplied with a predetermined first voltage, a pair of electrodes and a gate electrode, wherein a threshold voltage of each of said memory elements is changed in accordance with a potential difference between said gate electrode and said substrate gate;
   a plurality of word lines coupled individually to the respective gate electrodes of said memory elements;
   switching means having a plurality of first regions coupled to the word lines and a second substrate gate adjacent to the first regions;
   voltage generator means for producing a second voltage and a third voltage of mutually different polarities;
   selector means coupled to said plurality of word lines through said switching means and for selecting one from said plurality of word lines; and
   voltage supply means coupled to said selector means, to said voltage generator means and to said switching means, including means for supplying a voltage, which substantially conforms with one of said second and third voltages, to said word line selected by said selection means, and means for changing the potential of said second substrate gate of said switching means.

2. A semiconductor memory device according to claim 1, wherein said voltage supply means includes first selector means having a plurality of output nodes corresponding to said plurality of word lines, for producing a voltage which substantially conforms with said second voltage and for outputting said voltage from said output node corresponding to said selected word line.

3. A semiconductor memory device according to claim 2, wherein said voltage supply means includes second selector means having a plurality of output nodes corresponding to said plurality of word lines, for producing a voltage which substantially conforms with said third voltage and for outputting said voltage from said output node corresponding to said selected word line.

4. A semiconductor memory device according to claim 3, wherein each of first regions is one of source and drain regions in a MOSFET and said second substrate gate is a well region at which the MOSFET is formed.

5. A semiconductor memory device according to claim 4, wherein said switching means includes first switching means for coupling said selected word line and said output node of said first selector means in response to a first control signal.

6. A semiconductor memory device according to claim 5, wherein said switching means includes second switching means for coupling said selected word line and said output node of said second selector means in response to a second control signal.

7. A semiconductor memory device according to claim 6, wherein said first switching means includes a plurality of first MOSFETs having substrate gates which are connected mutually to one another and having conduction channels which are connected between the word lines and the output nodes of said first selector means; and said second switching means includes a plurality of second MOSFETs having substrate gates which are connected mutually to one another and having conduction channels which are connected between the word lines and the output nodes of said second selector means; said semiconductor memory device further comprising first voltage supply means coupled to the substrate gates of said first and second MOSFETs and supplying to said substrate gates a voltage which substantially conforms with said second or first voltage.

8. A semiconductor memory device according to claim 7, wherein the respective substrate gates of said memory elements are composed of a single first semiconductor region; the respective substrate gates of said first MOSFETs are composed of a single second semiconductor region; and the respective substrate gates of said second MOSFETs are composed of a single third semiconductor region.

9. A semiconductor memory device according to claim 8, wherein each of said first, second and third semiconductor regions is formed in a single fourth semiconductor region.

10. A semiconductor memory device according to claim 1, wherein the respective substrate gates of said memory elements are formed in a single semiconductor region.

11. A semiconductor memory device according to claim 10, wherein said semiconductor region is formed in a semiconductor substrate.

12. A semiconductor memory device according to claim 1, wherein said second and third voltages have a voltage level substantially equal to one another.

13. A semiconductor memory device according to claim 1, wherein said second voltage has a voltage level and polarity for writing information into said memory elements, and wherein said third voltage has a voltage level and a polarity for erasing information stored in said memory elements.

14. A semiconductor memory device according to claim 13, wherein said second and third voltages have a voltage level substantially equal to one another.

15. A semiconductor memory device comprising:
a plurality of non-volatile memory elements each having a pair of electrodes and a gate electrode and formed at a main surface of a first well region;
a high voltage generator for producing, from a supply voltage received, a writing high voltage of one polarity and an erasing high voltage of another polarity;
level converter circuits for selectively outputting either of said high voltages in response to the output signal of a decoder circuit;
switch MOSFETs formed at a main surface of a second well region, provided between outputs of said level converter circuits and word lines to which the gates of non-volatile memory elements are coupled, and serving to selectively feed either of said writing and erasing high voltages in accordance with whether said semiconductor memory device is in a writing or an erasing operation mode; and
a well potential control circuit for changing the potential of said second well region, where said switch MOSFETs are located, in conformity with a switching action of said switch MOSFETs.

16. A semiconductor memory device according to claim 15, wherein said non-volatile memory element are comprised of MNOS transistors with drains thereof coupled to data lines, and wherein address selecting switch MOSFETs are provided between sources of said MNOS transistors and a common source line.

17. A semiconductor memory device according to claim 16, wherein each of said data lines is equipped with a data holding latch circuit and a level converter circuit for selectively generating said high voltage in conformity with the data being held in said latch circuit.

18. A semiconductor memory device according to claim 15, wherein said writing high voltage and said erasing high voltage have voltage levels which are substantially equal to one another.

19. A semiconductor memory device according to claim 15, wherein said memory elements are arranged in a memory array, and wherein said decoder circuit is an X-decoder for selecting predetermined word liens in said memory array.

20. A semiconductor memory device according to claim 19, wherein said memory elements in said memory array are arranged in a second well region separate from said first well region.

21. A semiconductor memory device according to claim 20, further comprising means for holding a potential of said second well region at a fixed potential level regardless of said switching action of said switching MOSFETs.

22. A semiconductor memory device according to claim 21, wherein said holding means holds the potential of said second well region at a ground potential.

23. A semiconductor memory device according to claim 22, wherein said well potential control circuit changes a potential so said first well region between a ground potential and a potential substantially corresponding to said erasing high voltage is in conformity with said switching action of said switch MOSFETs.

24. A semiconductor memory device according to claim 15, wherein said well potential control circuit changes a potential so said first well region between a ground potential and a potential substantially corresponding to said erasing high voltage is in conformity with said switching action of said switch MOSFETs.

25. A semiconductor memory device comprising:
a semiconductor substrate having a main surface and supplied with a first voltage;
a well region formed at said main surface;
a plurality of memory elements each having a pair of electrodes and a gate electrode and being formed at said main surface of said substrate;
a plurality of word lines coupled individually to the respective gate electrodes of said memory elements;
voltage generator means for producing a second voltage and a third voltage of mutually different polarities;
a plurality of switching MOSFETs formed at a main surface of said well region, each of said switching MOSFETs having a first electrode coupled to one of said word lines;
selection means coupled to said voltage generator means and to a second electrode of each of said switching MOSFETs, for selecting one from said plurality of word lines and providing one of said second and third voltages to said selected word line; and means, coupled to said voltage generator means, for providing one of said first and second voltages to said well region.

26. A semiconductor memory according to claim 25, wherein said well region is comprised of a first well region and a second well region.

27. A semiconductor memory according to claim 26, wherein said memory elements are disposed between said first and second well regions.

28. A semiconductor memory according to claim 27, wherein said selection means includes a first selection circuit and a second selection circuit.

29. A semiconductor memory according to claim 28, wherein said first selection circuit is coupled to the second electrode of each of said plurality of first switching MOSFETs formed at said main surface of said first well region and provides said second voltage to said selected word line.

30. A semiconductor memory according to claim 29, wherein said second selection circuit is coupled to the second electrode of each of said plurality of second switching MOSFETs formed at said main surface of said second well region and provides said third voltage to said selected word line.

31. A semiconductor memory according to claim 30, wherein said first switching MOSFETs couple said first selection circuit and said word lines when the data stored in said memory elements is erased.

32. A semiconductor memory according to claim 31, wherein said second switching MOSFETs couple said second selection circuit and said word lines when the data into said memory elements is written.

33. A semiconductor memory device comprising:
a semiconductor substrate having a main surface and supplied with a first voltage;
a first well region formed at said main surface of said substrate;
a second well region formed at said main surface of said substrate;
a plurality of memory elements each having a pair of electrodes and a gate electrode and being formed at said main surface of said substrate, wherein a threshold voltage of each of said memory elements is changed in accordance with a potential difference between said gate electrode and said semiconductor substrate;
a plurality of word lines coupled individually to the respective gate electrodes of said memory elements;
voltage generator means for producing a second voltage and a third voltage of mutually different polarities;
first selection means for selecting one from said plurality of word lines, wherein said first selection means is coupled to said voltage generator means and includes means for providing said second voltage to said selected word line to erase data of said memory elements coupled to said selected word line;
second selection means for selecting one from said plurality of word lines, wherein said second selection means is coupled to said voltage generator means and includes means for providing said third voltage to said selected word line to write data into said memory elements coupled to said selected word line;
a plurality of first switching MOSFETs formed at a main surface of said first well region, wherein said first switching MOSFETs couple said word lines and said first selection means when data stored in said memory elements is erased;
a plurality of second switching MOSFETs formed at a main surface of said second well region, wherein said second switching MOSFETs couple said word lines and said second selection means when data is written into said memory elements; and
means coupled to said voltage generator means and for providing said first voltage to said first and second well regions when data into said memory elements is written and for providing said second voltage to said first and second well regions when data of said memory elements is erased.

34. A semiconductor memory according to claim 33, wherein a first electrode of said first switching MOSFETs is coupled to said one of said word lines and a second electrode of said first switching MOSFETs is coupled to said first selection means.

35. A semiconductor memory according to claim 34, wherein a first electrode of said second switching MOSFETs is coupled to said one of said word lines and a second electrode of said second switching MOSFETs is coupled to said second selection means.

* * * * *